United States Patent [19]
Yu et al.

[11] Patent Number: 5,907,895
[45] Date of Patent: Jun. 1, 1999

[54] WAFER TWEEZER ASSEMBLING DEVICE

[75] Inventors: Chi Fu Yu, Taipei; Hua Ching Hsu, Chun-Tung, both of Taiwan

[73] Assignee: Taiwan Semiconductor Manufacturing Co., Ltd., Hsin-Chu, Taiwan

[21] Appl. No.: 08/810,362

[22] Filed: Mar. 3, 1997

[51] Int. Cl.[6] ........................................................ B25B 1/20
[52] U.S. Cl. ........................ 29/281.5; 294/64.1; 414/741; 269/296
[58] Field of Search ...................................... 294/1.1, 64.1, 294/65, 86.4, 87.1, 99.1; 29/281.1, 281.5, 464, 467, 559; 269/37, 45, 289 R, 296, 309; 414/935, 937–939, 941

[56] References Cited

U.S. PATENT DOCUMENTS

| | | |
|---|---|---|
| 4,165,067 | 8/1979 | Jernigan ............................. 29/281.1 X |
| 4,755,340 | 7/1988 | Ermer ................................. 29/281.1 X |
| 5,382,128 | 1/1995 | Takahashi et al. .................. 414/937 X |
| 5,556,147 | 9/1996 | Somekh et al. ........................ 294/64.1 |
| 5,562,387 | 10/1996 | Ishii et al. ............................ 414/937 X |
| 5,647,626 | 7/1997 | Chen et al. ............................. 294/87.1 |

*Primary Examiner*—Johnny D. Cherry
*Attorney, Agent, or Firm*—Tung & Associates

[57] ABSTRACT

The present invention provides a wafer tweezer assembling device by utilizing a chuck member and a plurality of tweezer blades separated by spacers having a predetermined thickness such that the mounting and the calibration of the tweezer can be accomplished in one operation without the need of further calibration steps after the assembling process.

10 Claims, 2 Drawing Sheets

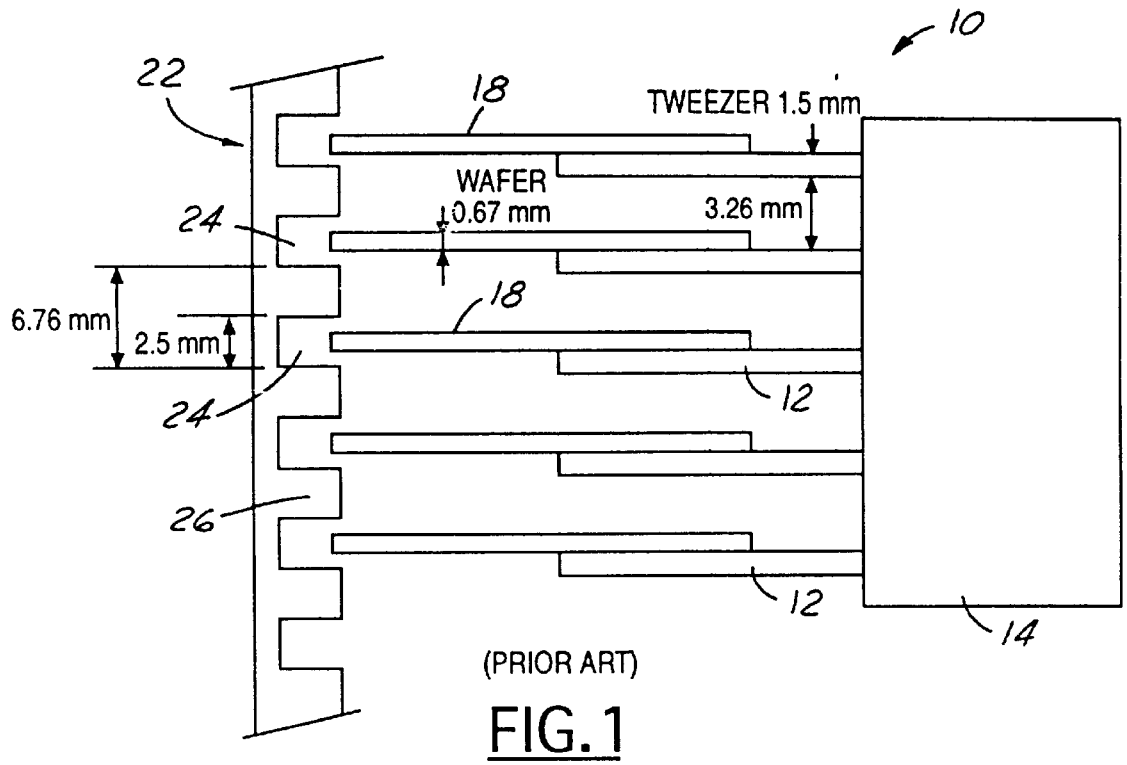
(PRIOR ART)
FIG. 1
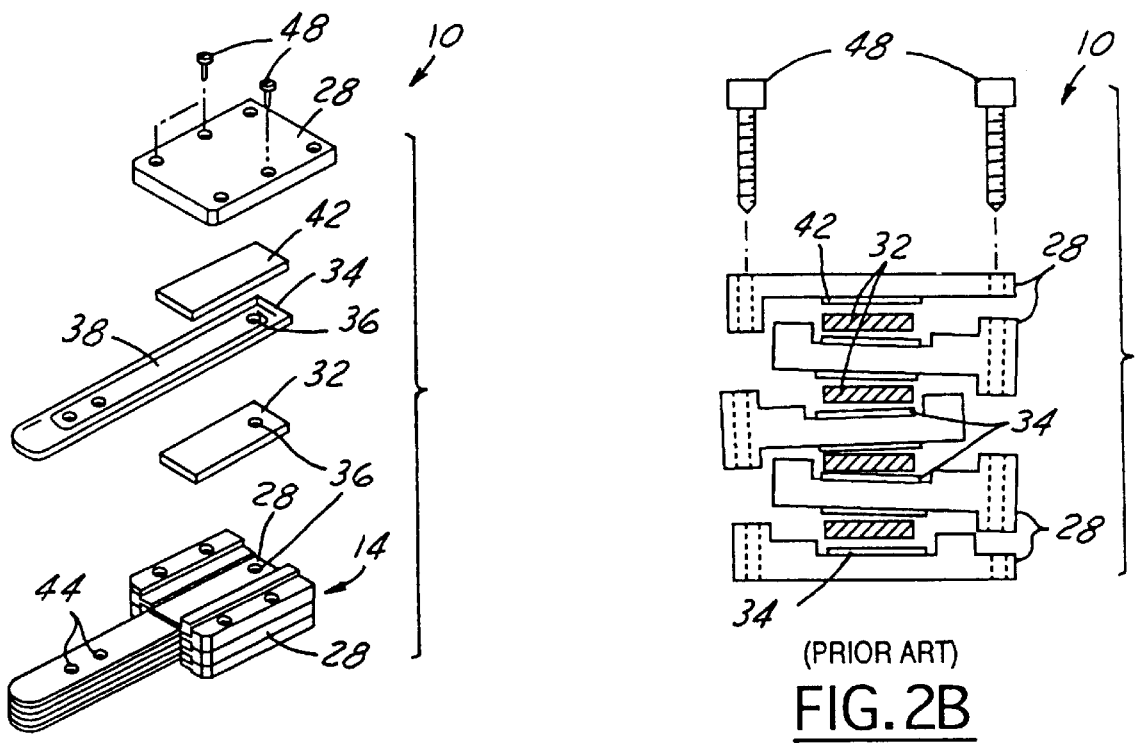
(PRIOR ART)
FIG. 2A
(PRIOR ART)
FIG. 2B

WAFER TWEEZER ASSEMBLING DEVICE

FIELD OF THE INVENTION

The present invention generally relates to a wafer tweezer used in loading wafers into a wafer boat and more particularly, relates to a wafer tweezer assembling device that is capable of assembling and calibrating a wafer tweezer simultaneously in a single operation without further need for calibration.

BACKGROUND OF THE INVENTION

In semiconductor processing technology, wafers of a semi-conducting material are frequently processed for diffusion or oxidation in a reactor chamber. For instance, in a low pressure chemical vapor deposition reactor, a large number of wafers can be accommodated for each run. The wafers can be stacked side by side with only a few mm apart in a quartz reaction tube. The wafers are positioned in wafer holders, or sometimes called wafer boats, which can hold up to 200 wafers. When the wafers are held vertically and separated from each other by a narrow space, maximum wafer capacity can be achieved in a reaction chamber. When wafers are positioned in a diffusion or oxidation furnace, the wafers are placed perpendicular to a gas flow in a quartz tube that has a circular cross-section.

When designing a reactor, the geometry of the reactor is restricted by the pressure regime and the energy source of the reactor. The reactor geometry is also an important factor in the throughput of the reactor. Since atmospheric pressure reactors normally operate in the mass-transport-limited regime, the reactors must be designed such that an equal flow of reactants can be delivered uniformly to each wafer. As a result, it is more desirable to stack the wafers horizontally by laying them flat on a horizontal surface instead of stacking vertically at close spacing. An undesirable consequence of the horizontal wafer layout is the higher susceptibility of the wafers to be contaminated by falling particles.

A horizontal reactor consists of a quartz tube, radiantly heated by a multi-zone furnace. The reactor pressure ranges between about 0.2 Torr and about 2.0 Torr while the temperature ranges between about 250° C. and about 950° C. A vertical furnace operates essentially in the same manner as the horizontal furnace, except for the orientation of the wafers. In a vertical furnace, the wafers are loaded in a horizontal position by a wafer tweezer onto a quartz cassette which can be either lowered or raised into the furnace by an elevator device. One other benefit achieved by a vertical furnace over a horizontal furnace is that only a reduced area needs to be occupied in a clean room environment, and the reduced contamination during wafer processing.

One of the key steps involved in processing wafers in a vertical furnace requires the use of a wafer tweezer to load wafers into a wafer boat from cassettes. The wafer tweezer is frequently constructed of a quartz material in order to withstand high temperature and corrosive chemical exposures. A conventional wafer tweezer used to load wafers into a wafer boat is shown in FIG. 1.

Tweezer assembly 10 that has tweezer blades 12 mounted in a chuck base 14 is shown in FIG. 1 for loading wafers 18 into a wafer boat 22. The wafer boat 22 is generally machined of a quartz material with a plurality of wafer receptacles 24. The tweezer assembly 10 shown in FIG. 1 is commonly used in the loading of six-inch wafers. In a typical wafer boat such as that shown in FIG. 1, the pitch between the receptacles is approximately 4.76 mm and the height of each receptacle is approximately 2.5 mm. Since a typical six-inch wafer has a thickness of 0.67 mm, this leaves a space of approximately 0.9 mm between the wafer surface and the surface of the receptacles. During the loading of wafers into a wafer boat from a tweezer assembly, it is critical to have a very tight tolerance of the spacings between the tweezer blades such that the wafers may be loaded into the boat without touching the edges of the receptacles. The tweezer blades 12 are normally constructed of a quartz material and have a thickness of approximately 1.5 mm. The distance allowed between the tweezer blades in an assembled position is approximately 3.26 mm. The mounting of the tweezer blades 12 in chuck base 14 is therefore a very important step in a semiconductor processing technology. If tweezer blades 12 are not properly mounted in chuck base 14, the wafer loading process may cause damages to the wafers when the wafers are accidentally pushed into the walls 26 of the wafer boat 22.

A conventional process for assembling a wafer tweezer assembly 10 is shown in FIGS. 2A and 2B. In FIG. 2A, a perspective view of the various components of the tweezer assembly 10 is shown. In FIG. 2B, an end view of the components of the tweezer assembly 10 is shown. It is seen, in FIG. 2A, that a plurality of chuck plates 28 are assembled to form the chuck base 14. A plurality of Teflon gaskets 32 of approximately 0.1 mm thick are used as a seal between tweezer blades 34 and chuck plates 28. Vacuum ports 36 are provided in the tweezer blades 34, the Teflon gaskets 32 and the chuck plates 28 such that vacuum can be applied through slot openings 38 in the surface of tweezer blades 34 to securely hold wafers 18. At the top of each tweezer, silicon rubber gaskets 42 of approximately 0.5 mm thick are used as vacuum seals to keep each tweezer as a vacuum chamber independently. Vacuum can be applied through vacuum holes 36, slot opening 38 and vacuum holes 44 at the tip section of the tweezer blade 34 to hold the wafers.

FIG. 2B is an end view of an unassembled chuck base 10 consisting of chuck plates 28, Teflon gaskets 32 and tweezer blades 34. Mechanical means, such as four bolts 48 are used to fasten the plurality of chuck plates 28, the Teflon gaskets 32, the silicon rubber gasket 42 and the tweezer blades 34 together. In the assembling process for chuck base 14, the position of the tweezer blades 34 in relation to the chuck plates 28 is determined by the Teflon gaskets 32 and the silicon rubber gaskets 42. There is no reliable method available for calibrating the exact distance between the tweezer blades 34 such that wafers can be precisely positioned on top of the tweezer blades.

In assembling the tweezer assembly 10 shown in FIG. 2A, there is no assembly aid or guide which can be used for determining the position of the tweezer blades 34 and the gaskets 32, 42 in relation to the chuck plates 28. The assembling process for the tweezer assembly is therefore very difficult to execute. Moreover, the horizontal accuracy and the gap tolerance are difficult, or impossible to calibrate during such assembly.

It is therefore an object of the present invention to provide a wafer tweezer assembling device that can be easily utilized to assemble a wafer tweezer assembly.

It is another object of the present invention to provide a tweezer assembling device that can be used as a guide for fixing the positions of the various components in a tweezer assembly.

It is a further object of the present invention to provide a tweezer assembling device that performs not only the assembling function but also the calibration function simultaneously.

It is another further object of the present invention to provide a tweezer assembling device that can be utilized to assemble a wafer tweezer together without the need for further calibration procedures.

It is yet another object of the present invention to provide a tweezer assembling device that can be repeatedly used for assembling tweezer assemblies.

It is still another object of the present invention to provide a tweezer assembling device that utilizes spacers of a predetermined thickness for fixing the positions of the tweezer blades such that no further calibration is required.

It is still another further object of the present invention to provide a method for assembling and calibrating a wafer tweezer assembly simultaneously by utilizing a tweezer assembling device equipped with spacers of a predetermined thickness.

It is yet another further object of the present invention to provide a method for using a calibrated wafer tweezer assembly to load wafers into a process chamber by first utilizing a tweezer assembling device to assemble and calibrate a tweezer assembly.

SUMMARY OF THE INVENTION

The present invention provides a wafer tweezer assembling device that can be used to assemble and calibrate a tweezer assembly together in one operation without the need of further calibration.

In a preferred embodiment, a wafer tweezer assembling device is provided which includes a base member of a generally elongated rectangular shape for supporting a frame member and a chuck member, a plurality of tweezers each having a base section, a middle section and a tip section, a plurality of spacers each having a predetermined thickness for placement between two adjacent tweezers to fix the space therebetween, a frame member for supporting the tweezers at their middle sections with the spacers inserted therebetween, and a chuck member that has a chuck base and a plurality of chuck plates, the chuck plates are removably mounted to the base member with the base sections of the plurality of tweezers inserted therebetween; the chuck member and the plurality of tweezers are removable from the base member and the frame member after assembly.

The present invention is further directed to a method of assembling and calibrating a wafer tweezer simultaneously by the operating steps of first providing a base member that has a generally elongated rectangular shape, providing a chuck member that has a chuck base and a plurality of chuck plates, securing the chuck plates to the base member, positioning a tweezer that has a base section, a middle section and a tip section on the chuck base, the base section of the tweezer is supported by the chuck base while the middle section of the tweezer is supported by a frame member generally of L or C shape for cradling the tweezer, positioning a chuck plate over the base section of the tweezer in contact with the chuck base through a locating means, detachably mounting a spacer of a predetermined thickness over the middle section of the tweezer, repeating the positioning step for the tweezer, the chuck plate and the spacer until a predetermined number of tweezers are mounted, positioning a chuck plate on top of a last tweezer mounted, and securing the position of all chuck plates and tweezers by mechanical means.

The present invention is also directed to a method of using a calibrated wafer tweezer assembly to load wafers into a process chamber including the steps of first providing a base member that has a generally elongated rectangular shape, providing a chuck member that has a chuck base and a number of chuck plates, securing the chuck base to the base member, positioning a tweezer that has a base section, a middle section and a tip section on the chuck base, the base section of the tweezer is supported by the chuck base while the middle section of the tweezer is supported by a frame member that is of L or C shape for cradling the tweezer, positioning a chuck plate over the base section of the tweezer in contact with the chuck base through a locating means, detachably mounting a spacer of a predetermined thickness over the middle section of the tweezer, repeating the positioning step for the tweezer, the chuck plate and the spacer until a predetermined of number of tweezers are mounted, positioning a chuck plate on top of a last tweezer mounted, securing the position of all chuck plates and tweezers by mechanical means, removing all spacers from the tweezers, and loading wafers into said tweezer and transferring the wafers into a wafer boat situated in a process chamber.

BRIEF DESCRIPTION OF THE DRAWINGS

These and other objects, features and advantages of the present invention will become apparent from the following detailed description and the appended drawings in which:

FIG. 1 is a side view of a tweezer assembly loaded with wafers being transferred into a wafer boat by a conventional method.

FIG. 2A is a perspective view of a conventional wafer tweezer assembly in a disassembled state.

FIG. 2B is an end view of the conventional tweezer assembly shown in FIG. 2A.

DETAILED DESCRIPTION OF THE PREFERRED EMBODIMENT

Figure 3:
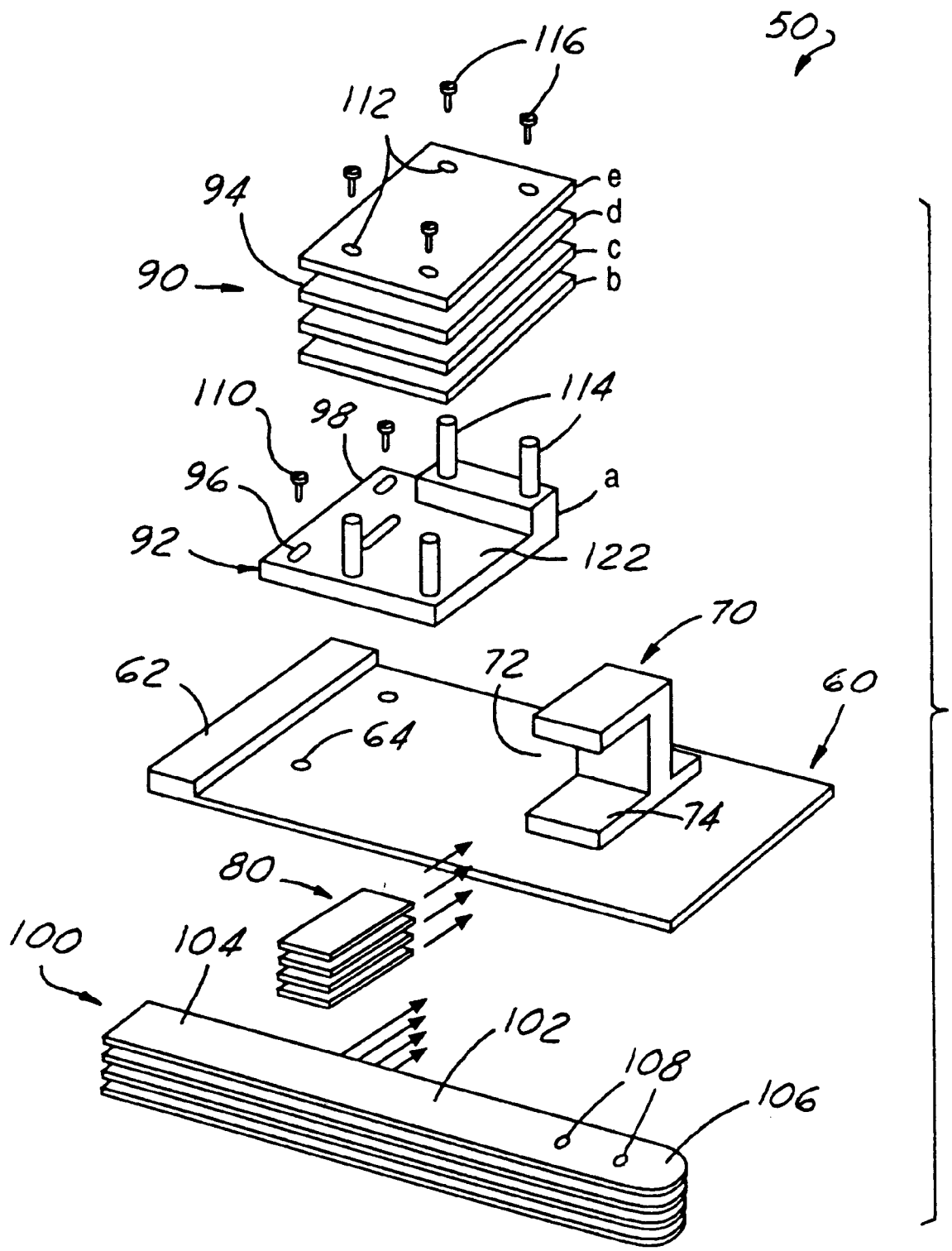
FIG. 3 is a perspective view of the present invention wafer tweezer assembling device that utilizes chuck plates and spacers.

The present invention provides a wafer tweezer assembling device that utilizes a chuck base and a number of spacers of predetermined thickness such that the tweezers can be assembled together in a calibrated state and that no further calibration step is required after assembling. After the tweezer blades are installed in a chuck base forming the tweezer assembly, the chuck base can then be mounted to a robotic arm such that it can be numerically controlled for loading wafers into wafer boats. The position of the tweezer blades in the chuck base must be precisely controlled to allow very small tolerances. If the tweezer blades are not properly installed, either the wafers loaded on the tweezer or the wafer boat can be damaged during the operation of the tweezer. The present invention device allows the mounting and the calibration of tweezer blades in a chuck base simultaneously in one operation. The tweezer blades and the chuck base are usually manufactured of a high temperature and chemical resistant material, such as aluminum and quartz glass.

The calibration of the tweezer blades mounted in a tweezer assembly is important since the loading speed of wafers into wafer boats is directly dependent on such accuracy. In a wafer processing chamber, such as in a low pressure chemical vapor deposition chamber, a total of between 150 to 200 wafers may be installed in the chamber for processing. Since each wafer boat normally holds 24 wafers, and each tweezer assembly may load, for instance, 5 wafers each time into the wafer boat, a total loading time for the processing chamber may take between 15 and 30 minutes. The wafer loading time can be significantly increased if the tweezer assembly is not assembled properly such that loading problems occur. It is therefore an important process step in semiconductor fabrication that the wafer tweezer assembly must be properly assembled and calibrated for use such that reliable loading of wafers into wafer boats can be carried out.

Referring now to FIG. 3, where a present invention tweezer assembly 50, a base member 60, a frame member 70 and a plurality of spacers 80 are shown. The base member 60 is generally constructed of an elongated rectangular shape for supporting the frame member 70 and the chuck member 90 of the tweezer assembly 50. The base member can be conveniently machined of a metal such as aluminum. At one end of the base member 60, a step 62 can be machined to provide a convenient locating means for the chuck base 92 of the chuck member 90. The base member 60 can also be provided with mounting holes 64 drilled into the base member 60 and possibly provided with threads. The mounting holes 64 are used for mounting the chuck base 92 during the assembling process for the chuck member and the tweezer blades 100. The base member 60 should have sufficient weight such that it can be used as a stable base for mounting the chuck member 90 to the tweezer blades 100.

The frame member 70 is machined of a convenient material such as aluminum. It can be shaped in either an L-shape or C-shape (as shown in FIG. 3) such that the middle sections 102 of the tweezer blades 100 and the spacers 80 can be securely cradled in the opening 72 of the frame member 70. The frame member 70 is mounted to the base member 60 by mechanical means such as screws or bolts (not shown) such that the frame member is fixed on the base member. A plurality of spacers 80 are provided; each has a predetermined thickness for placement between two adjacent tweezer blades 100 in order to fix the distance between the tweezer blades. The spacers can be conveniently manufactured of a non-contaminating material such as aluminum or quartz glass. Since the spacers are removed after the chuck member 90 and the tweezer blades 100 are assembled together and are not used in high temperature environment, they do not need to be made of a high temperature resistant or corrosion resistant material.

The chuck member 90 consists of a chuck base 92 and a plurality of chuck plates 94. The chuck base 92 can be machined of aluminum that withstands a high temperature and corrosive environment. It should have approximately the same width as the base member 60 such that it can be conveniently placed on top of and secured to the base member 60 through elongated bolt holes 96 and the screw holes 64 in the base member 60. To facilitate the mounting of chuck base 92 to the base member 60, the end 98 of the chuck base 92 is usually abutted against the step 64 built into the base member 60. Mounting means such as screws or bolts 110 are used to secure the chuck base 92 to the base member 60.

To facilitate the alignment of the chuck plates 94 to the chuck base 92, a plurality of locating holes 112 are provided in chuck plates 94 to engage locating pins 114 provided on the top surface of the chuck base 92. The locating pins 114 can be hollow centered with threads in order to accept screws or bolts 116 which secure the chuck member 90 after the chuck plates 94, the chuck base 92, and the tweezer blades 100 are assembled together in a manner that will be described.

The tweezer blades 100 have a base section 104, a middle section 102 and a tip section 106. To withstand the high temperature and corrosive environment in a reactor chamber, the tweezer blades 100 are normally manufactured of quartz glass. The blades 100 further include vacuum holes 108 provided at the tip section 106 of the blades 100. Vacuum is provided to the underside of the blades through a slot opening (not shown) similar to that of the slot opening 38 shown in FIG. 2A. Vacuum is provided to vacuum holes 108 through the slot opening and the vacuum holes (not shown) at the base section 104 of the tweezer blades 100.

The chuck member 90 and the tweezer blades 100 can be conveniently assembled together by the present invention novel method in the following manner. First, the chuck base 92 is mounted to the base member 60 by aligning the elongated screw slots 96 with the screw holes 64 and using screws 110. The frame member 70 is then mounted by mechanical means (not shown) to the base member 60 at a predetermined location with the opening 72 facing inwardly. A tweezer blade 100 is then placed on the top surface 122 of the chuck base 92 and the top surface 74 of the base of the frame member 70. The base section 104 of the tweezer blade rests on the surface 122 of the chuck base 92 while the middle section 102 of the tweezer blade 100 rests on the top surface 74 of the frame member 70. A chuck plate 94 is then placed on top of the tweezer blade 100 through the locating holes 112 and the locating pins 114 on the chuck base 92. Subsequently, a spacer 80 is placed on top of the middle section 102 of the tweezer blade 100 for fixing the distance between the blade that is mounted and the blade to be mounted on top.

A second tweezer blade 100 is then placed on top of the chuck plate 94 and the spacer 80 with the base section 104 resting on the chuck plate 94 and the middle section 102 resting on the spacer 80. A second chuck plate 94 and a second spacer 80 are then mounted in a similar manner on top of the second tweezer blade 100. This process is repeated until all four tweezer blades 100, all four chuck plates 94 and spacers 80 are mounted. Bolts 116 are then fastened to the internal threads provided in the locating pins 114 through the mounting holes 112 to securely fasten the chuck plates 94, the base section 104 of the tweezer blades 100 and the chuck base 92 together. After a secure mount is achieved, the chuck base 92 is removed from the base member 60 by removing screws 110 from the mounting holes 64. The spacers 80 inserted between the middle sections 102 of the tweezer blades 100 can be removed at this time while the distance between the tweezer blades 100 are maintained in an accurately calibrated position.

The present invention also provides a method of mounting wafers to a wafer boat by using the novel wafer tweezer assembled. The wafers can be placed on top of the tweezer blades 100 and secured by pulling vacuum through vacuum holes 108 and the chuck base 90 such that the wafers can be securely delivered to the receptacles in the wafer boat. At such time, the vacuum is shut off and the tweezer blades can be withdrawn while leaving the wafers in the receptacles.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A wafer tweezer assembling device comprising:
   a plurality of spacers each having a predetermined thickness for placement between two adjacent tweezer blades to fix the distance thereinbetween, said tweezer blades are selected from a plurality of tweezer blades each having a base section, a middle section and a tip section a frame member for supporting the tweezer blades at their middle section with said spacers inserted thereinbetween, and a chuck member having a chuck base and a plurality of chuck plates, said plurality of chuck plates for mounting to said chuck base with the base section of each of said plurality of tweezer blades mounted between two adjacent chuck plates, said chuck member and said plurality of tweezer blades being removable from said frame member after assembly.

2. A wafer tweezer assembling device according to claim 1, wherein said chuck member and said frame member are removably mounted to a base member of generally elongated rectangular shape by mechanical means.

3. A wafer tweezer assembling device according to claim 2, wherein said base member is provided with threaded mounting holes for said chuck member.

4. A wafer tweezer assembling device according to claim 2, wherein said chuck base further comprising elongated slots for adjustably mounting to said base member.

5. A wafer tweezer assembling device according to claim 1, wherein said base member further comprises a stop on its top surface to facilitate the assembling of said chuck base.

6. A wafer tweezer assembling device according to claim 1, wherein said plurality of tweezer blades comprises at least four blades.

7. A wafer tweezer assembling device according to claim 1, wherein said frame member is generally of C-shape.

8. A wafer tweezer assembling device according to claim 1, wherein said plurality of chuck plates are mounted to said chuck base by mechanical means.

9. A wafer tweezer assembling device according to claim 1, wherein said plurality of chuck plates are mounted to said chuck base by screws with the base section of each said tweezer blade inserted between two adjacent chuck plates.

10. A wafer tweezer assembling device according to claim 1, wherein said chuck base further comprising locating means for mounting said chuck plates.

* * * * *